(12) United States Patent
Jung et al.

(10) Patent No.: US 7,282,786 B2
(45) Date of Patent: Oct. 16, 2007

(54) SEMICONDUCTOR PACKAGE AND PROCESS FOR MAKING THE SAME

(75) Inventors: Dae-Hoon Jung, Kaohsiung (TW); Seok-Won Lee, Kaohsiung (TW); Sang-Bae Park, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 0 days.

(21) Appl. No.: 11/332,891

(22) Filed: Jan. 17, 2006

(65) Prior Publication Data

US 2007/0164402 A1  Jul. 19, 2007

(51) Int. Cl.
*H01L 23/495* (2006.01)

(52) U.S. Cl. .................. 257/666; 257/734; 257/777; 257/E23.031; 257/E23.037; 257/E23.039; 438/123; 438/106

(58) Field of Classification Search ............... 257/666, 257/734, 777, 723, 724, 725, 415; 438/15, 438/106, 107, 108
See application file for complete search history.

(56) References Cited

U.S. PATENT DOCUMENTS

| | | | |
|---|---|---|---|
| 4,352,735 A * | 10/1982 | Turetsky | 210/238 |
| 5,343,076 A | 8/1994 | Katayama et al. | |
| 5,523,608 A * | 6/1996 | Kitaoka et al. | 257/433 |
| 5,859,759 A | 1/1999 | Moriyama et al. | |
| 6,683,370 B1 * | 1/2004 | McDonald et al. | 257/676 |
| 6,821,817 B1 * | 11/2004 | Thamby et al. | 438/112 |
| 6,927,482 B1 * | 8/2005 | Kim et al. | 257/670 |

FOREIGN PATENT DOCUMENTS

WO  WO 2005/038422  4/2005

* cited by examiner

*Primary Examiner*—Jerome Jackson
*Assistant Examiner*—Anthony Ho
(74) *Attorney, Agent, or Firm*—Thomas, Kayden, Horstemeyer & Risley

(57) ABSTRACT

A semiconductor package mainly includes a leadframe and a first semiconductor chip such as an application specific integrated circuit (ASIC) encapsulated in a first package body having a cavity for receiving a second semiconductor chip such as a pressure sensor chip, and a cover disposed over the cavity of the first package body. At least a portion of the first package body is formed between the second semiconductor chip and the die pad such that the second semiconductor chip is directly disposed on the portion of the first package body instead of the die pad.

14 Claims, 3 Drawing Sheets

US 7,282,786 B2

SEMICONDUCTOR PACKAGE AND PROCESS FOR MAKING THE SAME

FIELD OF THE INVENTION

This invention relates generally to semiconductor packages, and more particularly, to semiconductor packages having a plurality of semiconductor chips.

BACKGROUND OF THE INVENTION

With ever increasing demands for miniaturization and higher operating speeds, semiconductor packages having a plurality of semiconductor chips, i.e., multi-chip modules (MCMs), are increasingly attractive in a variety of electronics. MCMs which contain more than one die can help minimize the system operational speed restrictions imposed by long printed circuit board connection traces by combining, for example, the processor, memory, and associated logic into a single package. In addition, MCMs decrease the interconnection length between IC chips thereby reducing signal delays and access times.

However, in certain applications (e.g., tire pressure monitoring systems (TPMS) for monitoring the pressure in automotive tires), it is desirable to have one chip, e.g., a sensor chip separate from other integrated circuit chips for reasons of functionality, reliability, safety, and/or manufacturability. TPMS typically include a sensor chip for sensing tire pressure and an application specific integrated circuit (ASIC) responsive to temperature and system battery voltage.

TMPS have been packaged in a variety of ways. WO 2005/038422 A1 discloses that components for a tire pressure monitoring system (TPMS) may be packaged on a common leadframe in which the ASIC is over-molded and rendered insensitive to the local environment, and the sensor chip is disposed in open cavity sealed with a cover having pressure transfer aperture. However, the sensor chip of this conventional TPMS is directly supported by the die pad of the leadframe. Since there is a significant difference between the sensor chip and the die pad in coefficient of thermal expansion (CTE), the sensor chip and the die pad expand and contract in different amounts along with temperature fluctuations from the environment to which the sensor chip is exposed. This causes warpage of the sensor chip thereby resulting in adverse influences that makes the sensor chip unable to sense tire pressure. Furthermore, the thermal stress due to CTE mismatch may result in delamination between the sensor chip and the die pad or chip cracking. Also, such differences in CTE could induce undesirable strains in the mechanical and electrical connections between the sensor chip and the leadframe.

SUMMARY OF THE INVENTION

It is an object of the present invention to provide a semiconductor package for use in TPMS which overcomes, or at least reduces the above-mentioned problems of the prior art.

According to the above and other objects of the present invention, there is provided a semiconductor package mainly including a leadframe and a first semiconductor chip such as an application specific integrated circuit (ASIC) encapsulated in a first package body having a cavity for receiving a second semiconductor chip such as a pressure sensor chip, and a cover disposed over the cavity of the first package body. Note that, at least a portion of the first package body is formed between the second semiconductor chip and the die pad such that the second semiconductor chip is directly disposed on the portion of the first package body instead of the die pad. Since the first package body typically has a CTE substantially equal to the second chip, the aforementioned design can significantly reduce problems of delamination between the second chip and the die pad, chip warpage or even die cracking.

The present invention further provides a process for making the aforementioned semiconductor package. The process includes the following steps: (a) attaching a first semiconductor chip onto the die pad of the leadframe; (b) electrically coupling the first semiconductor chip to the first and second leads of the leadframe; (c) encapsulating the first semiconductor chip, the die pad and at least a portion of each of the first and second leads in a first package body having a cavity exposing an inner lead portion of each of the second leads, wherein at least a portion of the first package body is formed on an upper surface of the die pad; (d) mounting a second semiconductor chip in the cavity of the first package body and upon the portion of the first package body on the upper surface of the die pad; (e) electrically coupling the second semiconductor chip to the inner lead portions of the second leads; and (f) disposing a cover over the cavity of the first package body.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
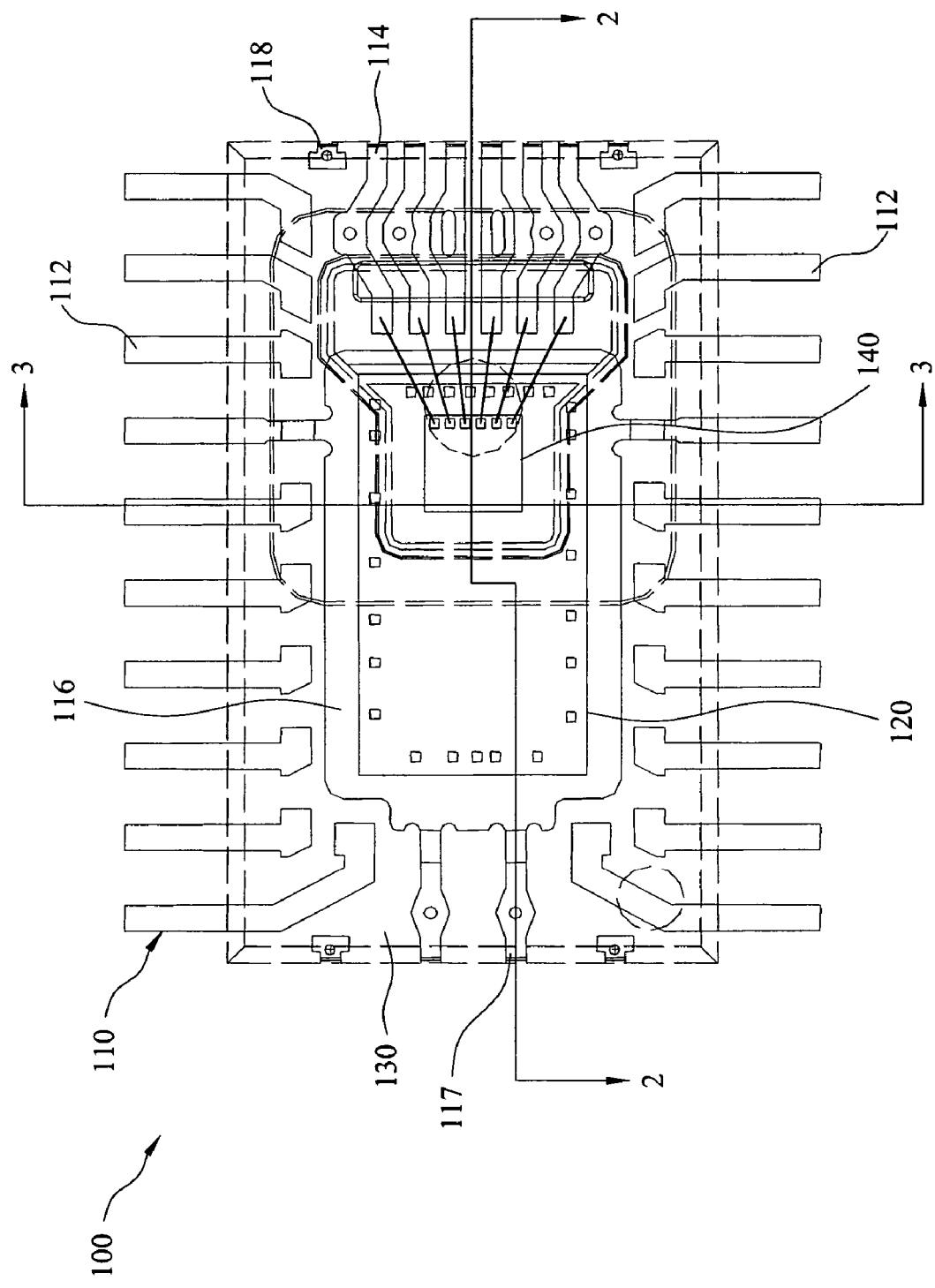
FIG. 1 is a top plan view of a semiconductor package according to one embodiment of the present invention.

While the present invention is susceptible of embodiment in various forms, there are presently preferred embodiments shown in the drawings and will hereinafter be described with the understanding that the present disclosure is to be considered as an exemplification of the invention and is not intended to limit the invention to the specific embodiment illustrated.

Figure 2:
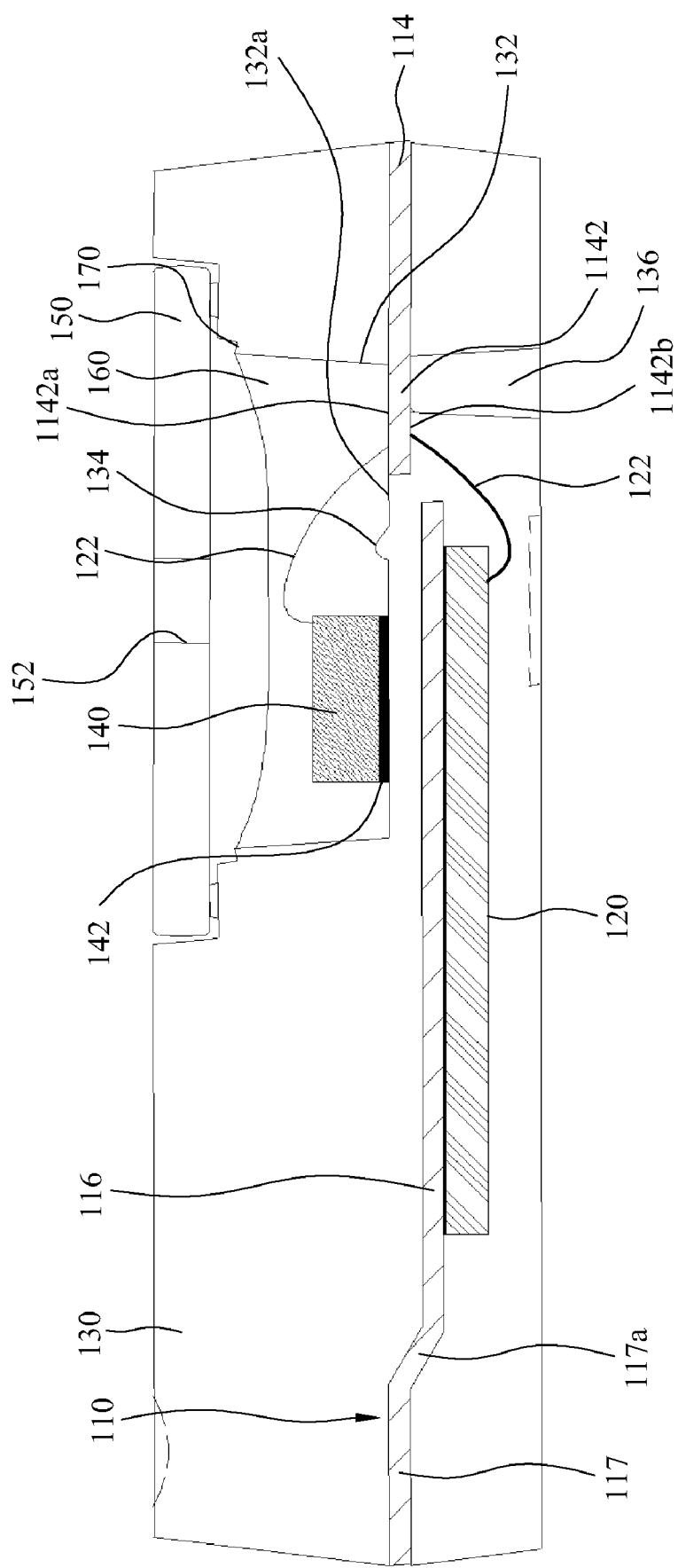
FIG. 2 is a cross-sectional view taken along line 2-2 of FIG. 1.
Figure 3:
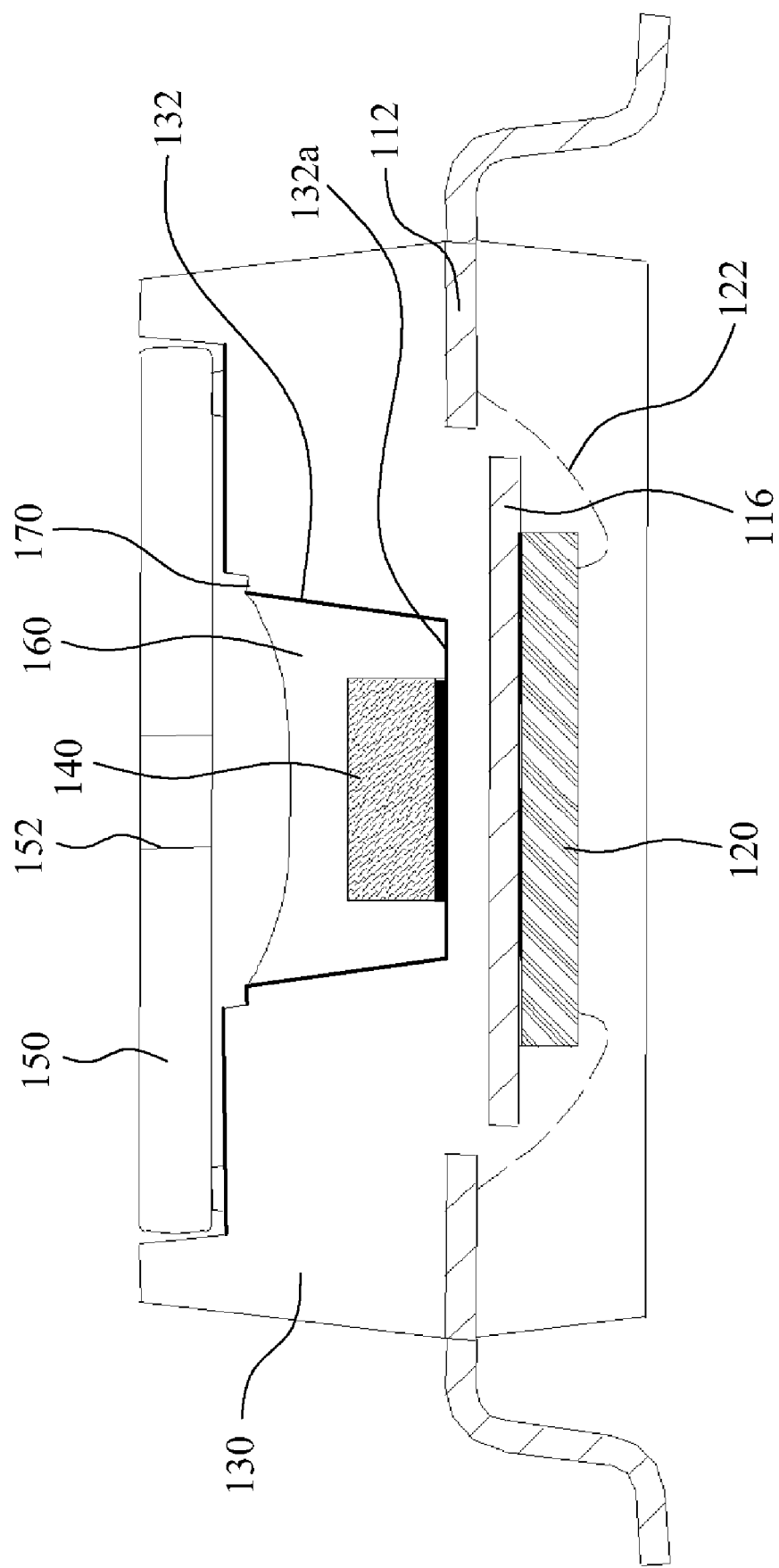
FIG. 3 is a cross-sectional view taken along line 3-3 of FIG. 1.

FIGS. 1-3 illustrate a semiconductor package 100 according to one embodiment of the present invention. FIG. 1 shows a top plan view of the semiconductor package 100. FIG. 2 is a cross-sectional view taken along line 2-2 of FIG. 1. FIG. 3 is a cross-sectional view taken along line 3-3 of FIG. 1. As shown, the semiconductor package 100 mainly includes a leadframe 110 and a first semiconductor chip 120 encapsulated in a first package body 130 having a cavity 132 for receiving a second semiconductor chip 140, and a cover 150 disposed over the cavity 132 of the first package body 130 (best shown in FIGS. 2 and 3). For example the first semiconductor chip 120 may be a discrete device, an integrated circuit, or a control chip, and the second semiconductor chip 140 may be a sensor that is to be exposed to the environment, e.g., a chemical sensor, a pressure sensor, a temperature sensor, an optical sensor, a velocity sensor, or an accelerometer. Alternatively, the second semiconductor chip 140 may be a surface acoustic wave (SAW) device, or another semiconductor chip. The cover 150 preferably has an aperture 152 for expose the second semiconductor chip 140 to ambient conditions, as is required for some types of electronic chips such as, for example, at least some of the sensors described above. The aperture 152 in the cover 150 is preferably sized for allowing the sensor (that is to be exposed to the environment) to communicate with the environment exterior to the semiconductor package and at the same time to prevent infiltration of contaminants into the cavity 132.

The lead frame 110 includes a plurality of first and second leads 112, 114 arranged about the periphery of a die pad 116. The lead frame 110 may be made of a copper-base alloy or made of copper or alloys containing copper. Lead frames suitable for use in the present invention are available in three lead finishes: post plated SnPb, Matte Sn, and pre plated Ni/Pd with flash of Au (i.e., PPF (Pre-Plating Lead Frame)). The first and second leads 112, 114 are all connected to a dam bar (not shown). The die pad 116 is connected to the dam bar via four tie-bars 117. Preferably, the lead frame 110 is provided with dummy tie-bars 118.

The first semiconductor chip 120 is securely attached to a lower surface of the die pad 116 via an adhesive such as silver epoxy or other nonconductive adhesives (not shown), and electrically coupled to the first and second leads 112, 114 via a plurality of bonding wires 122 (not shown in FIG. 1 but shown in FIGS. 2 and 3). The first semiconductor chip 120 is encapsulated in the first package body 130 for moisture resistance and shock resistance. The first package body 130 also encapsulates the die pad 116 and at least a portion of each of the first and second leads 112, 114. The upper surface 1142a of the inner lead portion 1142 of each of the second leads 114 is exposed in the bottom surface 132a of the cavity 132 for electrically coupling to the second semiconductor chip 140. In addition, the first leads 112 respectively has an outer lead portion extending outwardly of the first package body 130 from the lateral sides, which, in turn, can be formed into standard lead configurations such as gull-wing (see FIG. 3).

The second semiconductor chip 140 is securely attached to a bottom surface 132a of the cavity 132 via an adhesive 142 such as silver epoxy or other nonconductive adhesives, and electrically coupled to the second leads 114 via a plurality of bonding wires 122 (best shown in FIG. 2). Preferably, the first package body 130 has a protrusion portion 134 projecting from the bottom surface 132a of the cavity. The protrusion portion 134 is located between the second semiconductor chip 140 and the exposed upper surfaces 1142a of the inner lead portions 1142 of the second leads 114 for preventing the adhesive 142 from bleeding to contaminate the exposed upper surfaces 1142a. Preferably, a flexible encapsulant is applied over the second semiconductor chip 140 to form a second package body 160. In this embodiment, a stopper structure 170 is preferably formed in the walls of the first package body 130 erected around the cavity 132 for preventing the encapsulant from overflowing out of the cavity 132.

Note that, as best shown in FIGS. 2 and 3, at least a portion of the first package body 130 is formed between the second semiconductor chip 140 and the die pad 116 such that the second semiconductor chip 140 is directly disposed on the portion of the first package body 130 instead of the die pad 116. Since the package body 130 typically has a CTE substantially equal to the chip, the aforementioned design can significantly reduce problems of delamination between the chip and the die pad, chip warpage or even die cracking.

Preferably, the first package body 130 is formed by a conventional molding process such as transfer molding. During the molding process, the lead frame 110 is held in position by upper and lower mold chases (not shown) that together define a molding cavity shaped generally to conform to the first package body 130. The lower mold chase is preferably provided with a fixture pin for supporting the inner lead portions 1142 of the second leads 114 thereby preventing undesired mold flash on the exposed upper surfaces 1142a. The fixture pin will result in the formation of a hole 136 in the first package body 130, as best shown in FIG. 2.

In one embodiment, as best shown in FIG. 2, the generally planar die pad 116 does not extend in co-planar relation to other portion of the generally planar leadframe 110. Specifically, each tie-bar 117 is preferably formed to include a downset portion 117a such that the die pad 116 residing on a plane which is disposed below the plane of the other portion of the leadframe 110. In this way, at least a portion of the first package body 130 can be formed between the second semiconductor chip 140 and the die pad 116.

Preferably, as best shown in FIG. 2, the upper surface 1142a and the lower surface 1142b of the inner lead portion 1142 of each of the second leads 114 are electrically coupled to the first semiconductor chip 120 and the second semiconductor chip, respectively. In this way, the first and second semiconductor chips 120, 140 are electrically interconnected.

In one embodiment, the semiconductor package of the invention may be used in a tire pressure measurement system (TPMS) (not shown). In this embodiment, the semiconductor chip 120 may be an application specific integrated circuit (ASIC), and the second semiconductor chip 140 may be a pressure sensor chip. Preferably, the encapsulant for forming the second package body 160 has sufficient flexibility to allow the sensor chip to be responsive to changes in ambient pressure. Preferably, the outer lead portions of the first leads 112 are designed to be compatible with existing standardized TPMS.

Although the present invention is discussed in detail with respect to the semiconductor package 100 with two semiconductor chips, a semiconductor package with more that two semiconductor chips is still considered within the spirit and scope of the invention.

The present invention further provides a process for making the aforementioned semiconductor package. The process includes the following steps: (a) attaching the first semiconductor chip 120 onto the die pad 116 of the leadframe 110; (b) electrically coupling the first semiconductor chip 120 to the first and second leads 112, 114 of the leadframe 110; (c) encapsulating the first semiconductor chip 120, the die pad 116 and at least the portion of each of the first and second leads to form the first package body 130; (d) mounting the second semiconductor chip 140 in the cavity 132 of the first package body 130 and upon a portion of the first package body 130; (e) electrically coupling the second semiconductor chip 140 to the inner lead portions 1142 of the second leads 114; and (f) disposing the cover 150 over the cavity 132 of the first package body 130 to form a semiconductor-finished package.

In mass production, it is desirable to integrally form a plurality of lead frame units in a lead frame strip so that a plurality of semiconductor packages can be manufactured simultaneously. In this embodiment, a singulation step is conducted after step (f) to complete the packaging process. In addition, a pre-singulated test process may be conducted to significantly reduce the overall cost of test. This test performs the final electrical verification while packages are still together in the leadframe strip. Prior to the test, a cutting step such as a punch step is conducted to electrically isolate the leads 112 and 114 from each other and the dam bar while leaving the dummy tie-bars 118 substantially intact in order to connect the semiconductor-finished packages mentioned above to the leadframe strip.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A semiconductor package comprising:
   a leadframe having a die pad and a plurality of first and second leads arranged about the periphery of the die pad;
   a first semiconductor chip securely attached to a lower surface of the die pad, the first semiconductor chip being electrically coupled to the first and second leads;
   a first package body individually encapsulating the first semiconductor chip, the die pad and at least a portion of each of the first and second leads, the first package body having a cavity exposing an upper surface of an inner lead portion of each of the second leads;
   a second semiconductor chip disposed in the cavity of the first package body and above an upper surface of the die pad, the second semiconductor chip being electrically coupled to the inner lead portions of the second leads; and
   a cover disposed over the cavity of the first package body, wherein at least a portion of the first package body is interposed between the second semiconductor chip and the die pad.

2. The semiconductor package according to claim 1, wherein the second semiconductor chip is securely attached to a bottom surface of the cavity of the first package body via an adhesive, and the first package body has a protrusion portion projecting from the bottom surface of the cavity and disposed between the second semiconductor chip and the exposed upper surfaces of the inner lead portions of the second leads.

3. The semiconductor package according to claim 1, further comprising a second package body disposed in the cavity of the first package body for encapsulating the second semiconductor chip, and a stopper structure formed in walls of the first package body erected around the cavity for preventing the material of the second package body from overflowing out of the cavity.

4. The semiconductor package according to claim 1, wherein the second semiconductor chip is a sensor chip, and the cover has an aperture for allowing the sensor chip to communicate with the environment exterior to the semiconductor package.

5. The semiconductor package according to claim 4, further comprising a second package body disposed in the cavity of the first package body for encapsulating the second semiconductor chip, and the second package body is formed from a material having sufficient flexibility to allow the sensor chip to be responsive to changes in ambient pressure.

6. The semiconductor package according to claim 1, wherein the upper surface and an opposing lower surface of the inner lead portion of each of the second leads are electrically coupled to the first semiconductor chip and the second semiconductor chip, respectively.

7. The semiconductor package according to claim 1, wherein the leadframe further comprising a plurality of dummy tie-bars.

8. A process for making a semiconductor package, comprising:
   providing a leadframe having a die pad and a plurality of first and second leads arranged about the periphery of the die pad;
   attaching a first semiconductor chip onto the die pad of the leadframe;
   electrically coupling the first semiconductor chip to the first and second leads of the leadframe;
   individually encapsulating the first semiconductor chip, the die pad and at least a portion of each of the first and second leads in a first package body having a cavity exposing an inner lead portion of each of the second leads, wherein at least a portion of the first package body is formed to cover an upper surface of the die pad;
   mounting a second semiconductor chip in the cavity of the first package body and directly upon the portion of the first package body on the upper surface of the die pad, wherein the portion of the first package body is interposed between the second semiconductor chip and the die pad;
   electrically coupling the second semiconductor chip to the inner lead portions of the second leads; and
   disposing a cover over the cavity of the first package body.

9. The process according to claim 8, wherein the second semiconductor chip is securely attached to a surface of the cavity of the first package body via an adhesive, and the first package body has a protrusion portion projecting from the surface of the cavity and disposed between the second semiconductor chip and the exposed portions of the second leads.

10. The process according to claim 8, wherein the first package body has a stopper structure formed in walls of the cavity of the first package body, and the process further comprises applying a material to cover the second semiconductor chip wherein the stopper structure prevent the material from overflowing out of the cavity.

11. The process according to claim 8, wherein the second semiconductor chip is a sensor chip, and the cover has an aperture for allowing the sensor chip to communicate with the environment exterior to the semiconductor package.

12. The process according to claim 11, further comprising applying an encapsulant to cover the second semiconductor chip, wherein the encapsulant has sufficient flexibility to allow the sensor chip to be responsive to changes in ambient pressure.

13. The process according to claim 8, wherein the upper surface and an opposing lower surface of the inner lead portion of each of the second leads are electrically coupled to the first semiconductor chip and the second semiconductor chip, respectively.

14. The process according to claim 8, wherein the leadframe further comprises a plurality of dummy tie-bars and the process further comprises a cutting step to electrically isolate the first and second leads from each other while leaving the dummy tie-bars substantially intact.

* * * * *